United States Patent [19]
Dingwall

[11] 4,404,474
[45] Sep. 13, 1983

[54] ACTIVE LOAD PULSE GENERATING CIRCUIT

[75] Inventor: Andrew G. F. Dingwall, Bridgewater, N.J.

[73] Assignee: RCA Corporation, New York, N.Y.

[21] Appl. No.: 232,359

[22] Filed: Feb. 6, 1981

[51] Int. Cl.³ .................... H03K 19/08; H03K 19/34; H03K 5/153

[52] U.S. Cl. ................................. 307/260; 307/443; 307/451; 307/449; 307/471; 307/270

[58] Field of Search ............... 307/448, 260, 450, 451, 307/205, 270, 571, 577, 579, 581, 584, 585, 550, 449, 463

[56] References Cited

U.S. PATENT DOCUMENTS

| | | | |
|---|---|---|---|
| 3,772,536 | 11/1973 | Grannis et al. | 307/448 |
| 3,911,289 | 10/1975 | Takemoto | 307/451 |
| 4,039,858 | 8/1977 | Stewart | 307/358 |

*Primary Examiner*—Stanley D. Miller
*Assistant Examiner*—B. P. Davies
*Attorney, Agent, or Firm*—Joseph S. Tripoli; Henry I. Schanzer

[57] ABSTRACT

The conduction paths of a first, normally on, transistor and a second, normally off, transistor are connected in parallel between an output line and a circuit point at a first value of potential. When any one of a plurality of normally non-conducting input signal responsive means coupled to the output line, is enabled, it causes the potential on the output line to be driven to a second value of potential. Means are provided responsive to the potential on the output line for applying a turn-off signal to the first transistor followed by a delayed turn-on signal to the second transistor when the potential on the output line is driven towards the second value of potential and for applying a turn-on signal to the first transistor followed by a delayed turn-off signal to the second transistor when the potential on the output line is being restored to the first value of potential.

19 Claims, 7 Drawing Figures

ACTIVE LOAD PULSE GENERATING CIRCUIT

This invention relates to circuitry for generating a well-defined narrow pulse having sharp leading and trailing edges.

In the accompanying drawing like reference characters denote like components; and FIG. 1A is a schematic diagram of a prior art circuit;

FIG. 1B includes waveform diagrams of a typical output of the circuit of FIG. 1A and of a desired output signal;

FIG. 2 is a schematic diagram of a circuit embodying the invention;

FIG. 3 includes waveform diagrams of a signal applied to, and of an output signal produced by, the circuit of FIG. 2, and graphs illustrating the turn-on and turn-off sequence of load transistors in the circuit of FIG. 2;

In many applications it is necessary to produce a signal indicating that one or more of a multiplicity of events or conditions has occurred. By way of example, in a high speed memory it is desirable to quickly sense (detect) a voltage (or current) change on any of the many word and bit address lines and to then to produce a pulse or signal to precharge various portions of the memory circuit and to perform certain housekeeping functions prior to the read-out of information from the memory or the writing of information into the memory.

Figure 1A:
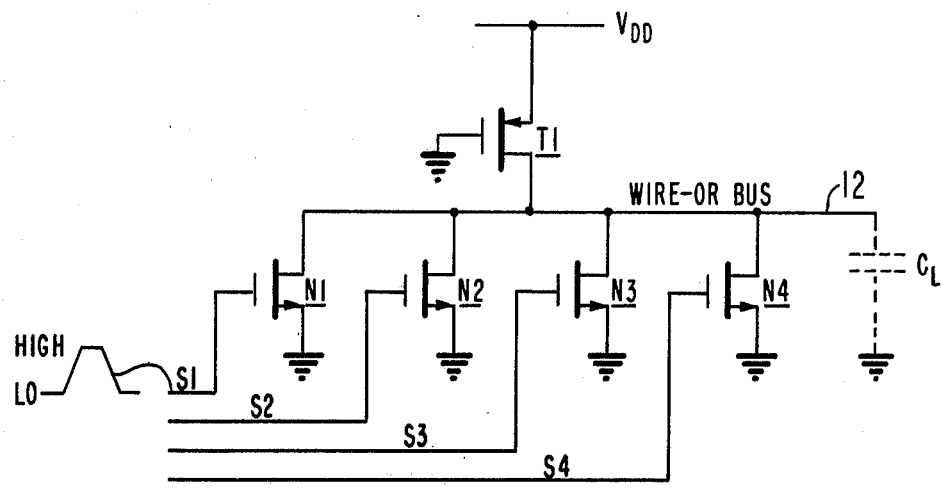

A known circuit suitable to perform the desired gating function and which may be characterized as a passive WIRE-OR circuit is shown in FIG. 1A. The circuit includes a grounded gate transistor T1, of P-conductivity type, functioning as a passive load, having its conduction path connected between a point of positive operating potential of $V_{DD}$ volts and an output line 12. Transistors N1 through N4, of N-conductivity type, responsive to respective input signals S1 through S4, have their conduction paths connected in parallel between line 12 and ground. Transistors N1 through N4 are normally turned-off while T1 is biased into conduction to normally maintain line 12 at, or close to, $V_{DD}$ volts. When any of transistors N1 through N4 is turned-on, it conducts to ground the current flowing into line 12 via T1 and also discharges capacitance CL towards ground potential. Thus, a negative-going pulse is generated. When the signal responsive transistors are turned-off, line 12 is recharged towards $V_{DD}$ volts via T1, terminating the negative-going pulse.

Figure 1B:
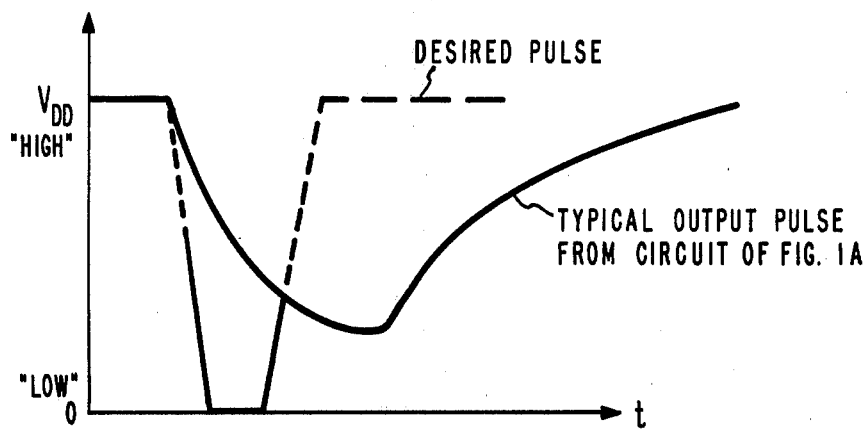

The circuit of FIG. 1A has been used successfully in many applications but suffers from various problems best explained by reference to the typical output waveform in FIG. 1B.

1. Conduction through T1 slows down the leading (falling) edge of the negative-going pulse on the WIRE-OR line when one or more of the signal responsive transistors (N1–N4) is turned-on.

2. The signal on the WIRE-OR line cannot go all the way to ground, due to the voltage divider action between T1 and the signal responsive transistors N1–N4. The low level of the output signal is not well defined and circuits responsive to the signal may not be fully or quickly turned-on or off.

3. The trailing (rising) edge of the output pulse has a very long time constant due to the high ON impedance of T1 having to charge up the relatively large capacitance, CL, associated with line 12. In large memories, more transistors, than the four signal responsive transistors shown in FIG. 1A by way of example, are normally connected in parallel, further increasing CL. This results in a very slow rising potential on the WIRE-OR line.

4. The dynamic power dissipation is quite high since T1 is always ON.

The problems discussed above arise primarily because of the use of a passive load (i.e. grounded gate transistor T1). This type of load is used because the input signals (e.g. changes in the voltage level on the address lines) are randomly applied to the system. Thus, it is impractical to clock the load and switch-it-off prior to the turn-on of the signal responsive transistors.

In a circuit embodying the invention the problems associated with the prior art circuit are eliminated or at least greatly reduced by dynamically driving a controllable load means on and off as a function of a signal (or voltage) generated at the output of the circuit. One embodiment of the invention includes an output line to which randomly activated input signal responsive transistors are connected. A controllable load means is connected between the output line and a point of operating potential. A means responsive to the signal on the output line is coupled to the load means for:

(a) maintaining the load means in a relatively high impedance state when none of the input signal responsive transistors is turned-on;

(b) switching the load means to a very high impedance state when an input signal responsive transistor is turned-on; and (c) switching the load means to a relatively low impedance state for a given time period some time after an input signal responsive transistor is turned-on.

Figure 2:
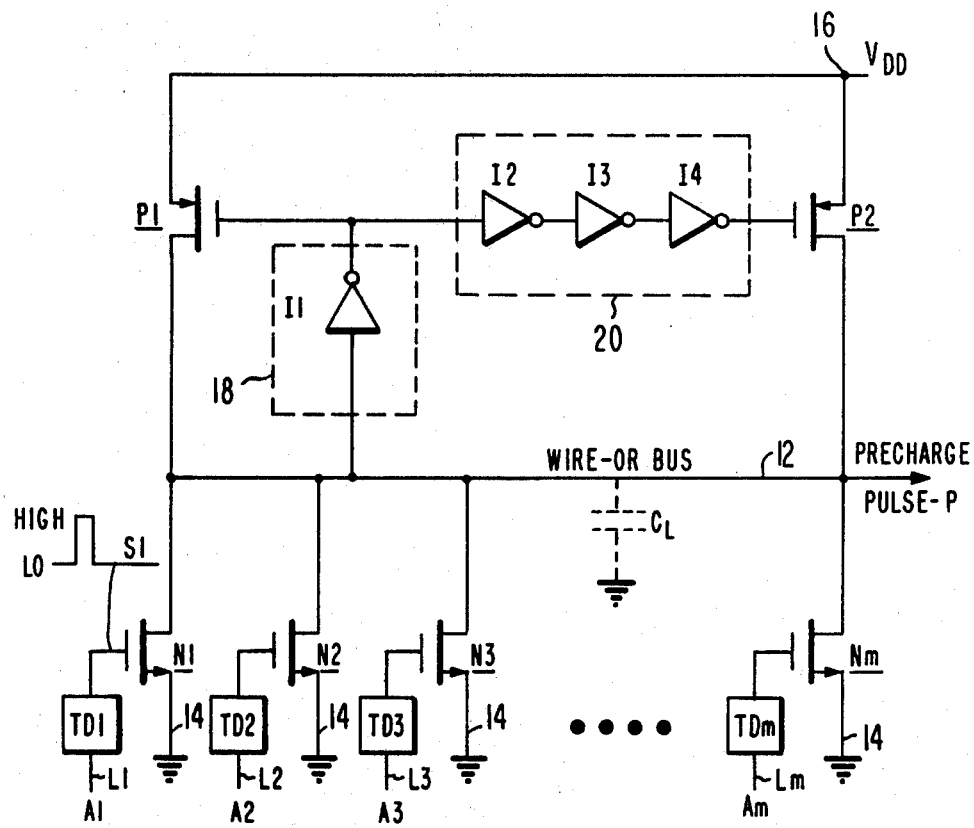
Figure 3:
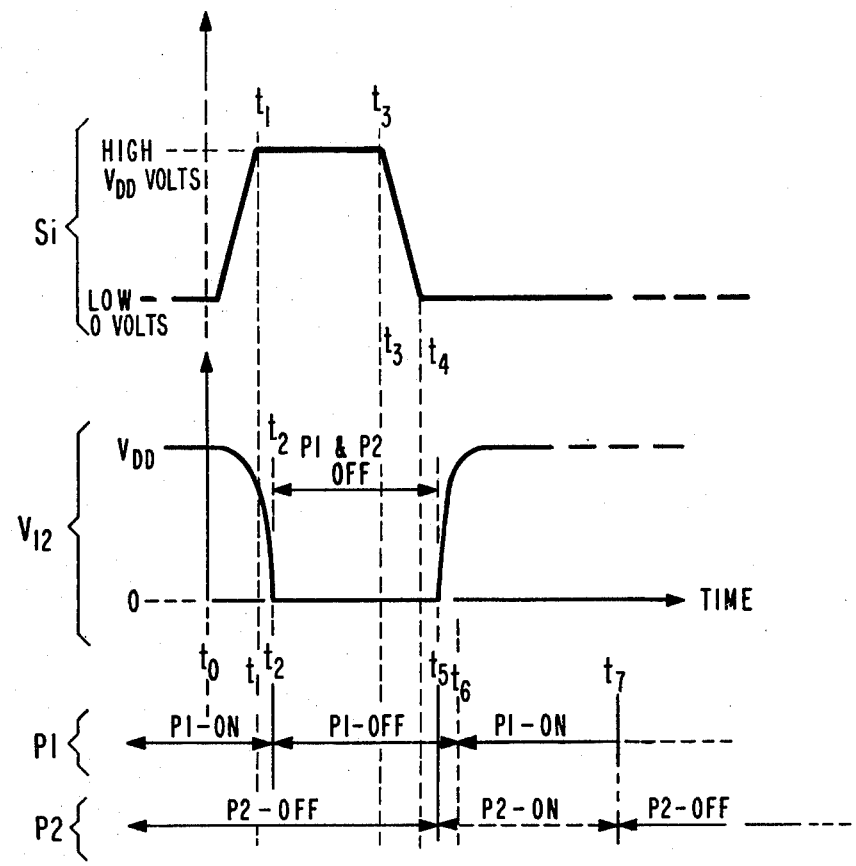

The circuit of FIG. 2 includes insulated-gate field-effect transistors (IGFETs) N1 through Nm, of N-conductivity type, having their conduction paths connected in parallel between a WIRE-OR BUS 12 and ground potential. The gate electrode of each one of the transistors Ni, where $1 \leq i \leq m$, is connected to the output of a corresponding transition detector (TDi). The input of each TDi is connected to an address line Li to which is applied an address signal Ai. The transition detectors may be, for example, of the type shown in FIG. 1 or 3 of U.S. Pat. No. 4,039,858 titled TRANSITION DETECTOR, although any suitable transition detector may be used instead. Whenever an address Ai on any one of the address lines changes from a "high" to a "low" or from a "low" to a "high" its corresponding transition detector TDi produces a positive going pulse Si, as shown in FIG. 3, which is applied to the gate electrode of its corresponding Ni transistor. [The signal Si is the inverse or complement of the "C" output shown in FIG. 1 of the cited patent.] Thus, a positive going input pulse Si is produced per signal transition on address line Li. Each input signal responsive transistor Ni is normally turned-off, being turned-on only when its corresponding Si signal is high.

The circuit load includes IGFETs P1 and P2, of P-conductivity type, having their main conduction paths connected in parallel between line 12 and a terminal 16 to which is applied a positive operating potential of $V_{DD}$ volts. The ON impedance (ZP1) of P1 is substantially greater than the ON impedance (ZP2) of P2.

Figure 4A:
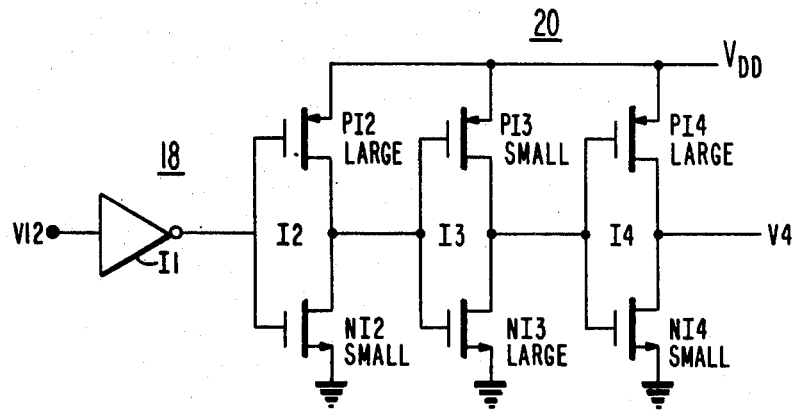
FIG. 4A is a schematic diagram of a delay network suitable for use in the circuit of FIG. 3.

That is, in terms of their geometries, P1 is a smaller device than P2. A circuit 18 connected between line 12 and the gate of P1 produces a signal at the gate of P1 which is the inverse or complement of the signal on line 12. In this embodiment circuit 18 is an inverter I1 connected at its input to BUS 12 and at its output to the gate of transistor P1. Inverter I1 produces at its output a signal which is the complement or inverse of, and which is only slightly delayed with respect to, the signal at its input. Three inverters I2, I3, and I4 are connected in cascade between the output of inverter I1 and the gate electrode of P2. Inverters I2, I3, and I4 form a circuit 20 which functions to delay the output of I1 while amplifying and inverting it prior to applying it to the gate of P2. The propagation delay through inverters I2, I3 and I4 is, in part, a function of the sizes of the transistors forming the inverters. Inverters I1, I2, I3 and I4 may be formed using transistors of complementary conductivity type, as shown in FIG. 4A; but alternatively could be formed employing transistors of single conductivity type or be any suitable inverter.

The combination of circuits 18 and 20 functions to provide a signal at the gate electrode of P2 which is of the same polarity as the signal on line 12 but which is delayed therefrom by the combined propagation delays of I1, I2, I3 and I4. Additional delays could be introduced in circuit 20 (or in circuit 18) so long as the signal at the gate of P2 is delayed with respect to, but of the same polarity as, the signal on line 12 and the signal at the gate of P1 remains the complement of the signal on line 12. As will be evident from the discussion below the out-of-phase signal produced and applied to the gate electrode of P1 by means of I1 could as well be produced by any other suitable circuit and the delayed in-phase signal applied to the gate of transistor P2 by means of circuits 18 and 20 could also be produced by any other suitable circuit. Note that a circuit performing the function of circuits 18 and 20 could be connected directly between output line 12 and the gate of P2; where this circuit is independent of the circuit connected between line 12 and the gate of P1.

The initial or static conditions (i.e. in the absence of an address change or a considerable time after an address change) of the circuit of FIG. 2 are as follows: (a) The Ni transistors are turned-off; (b) the voltage, V12, on BUS 12 is high (i.e. at $V_{DD}$); (c) the output, V1, of inverter I1 is low (i.e. at ground); (d) therefore P1 is turned-on; (e) the output V4, of inverter I4 is high (i.e. at $V_{DD}$); and (f) P2 is turned-off.

In response to the turn-on of any one of the Ni transistors by means of an Si signal as shown in FIG. 3, the voltage V12 on BUS 12 starts to go relatively negative, that is, toward ground. When V12 starts going relatively negative, inverter I1 amplifies and inverts the change and the output of I1 starts going from low to high. Since V1 is going positive the gate-to-source potential of P1 is reduced and its conduction is significantly reduced. Recall that P1 is, preferably, a very small device and its ON impedance is substantially greater than that of any Ni transistor. As P1 is being turned-off, its impedance increases further and the low current passing through its conduction path into line 12 is further decreased. The positive feedback loop comprising I1 and P1 ensures that after the initial drop in V12, V1 rises close to $V_{DD}$, and the turn-off of P1 is accelerated. Hence, the voltage V12 on line 12 can be quickly discharged towards ground via the turned-on Ni transistor with little counteracting effect via P1 which rapidly cuts off. The result is a fast falling leading edge in waveform V12 of FIG. 3 from time $t_1$, to $t_2$.

After P1 is turned-off and with P2 off, there is no low impedance path connected between lines 12 and 16. The WIRE-OR bus 12 and its associated capacitance can then be quickly discharged all the way to ground potential via a turned-on Ni transistor conducting in the common source mode as is shown in waveform V12 of FIG. 3 for time $t_2$ to $t_5$.

After P1 is turned-off P2 will remain turned-off for the period of time that it takes the low-to-high output voltage transition of I1 to propagate through I2, I3 and I4. After the propagation delay through I2, I3 and I4, the output of I4 (which is complementary to the output of I1) goes from high-to-low and P2 is turned-on. P2 is, preferably, a relatively large device and when it turns on it very quickly charges or pulls line 12 towards $V_{DD}$ volts, as is shown in waveform V12 of FIG. 3 for time $t_5$ to $t_6$. The initiating pulse Si is typically very narrow and normally terminates on or before the time that P2 is turned-on as shown for time $t_3$ to $t_4$ in FIG. 3. The pulse delay will normally be designed to be slightly greater than the Si pulse width so that it is assumed that P2 does not turn-on until the transistor Ni responsive to Si has turned-off. As soon as V12 is driven towards $V_{DD}$, the output of I1 begins to go low and transistor P1 is turned-on, further aiding in bringing V12 back towards $V_{DD}$. The high-to-low output transition of I1 is propagated via inverters I2, I3 and I4 causing, after the propagation delay, an amplified positive going signal to be applied to the gate of P2, which turns P2 off completely. The voltage on line 12 is then held at the high ($V_{DD}$) level only by means of transistor P1. Shortly after an Ni transistor is turned-on (between time $t_0$ and $t_1$), P1 is turned-off (at time $t_2$) while P2 remains turned-off. The turn-off of P1 while P2 is off during the first portion of the period discussed above enables the WIRE-OR BUS 12 to be discharged very quickly right down to ground (the voltage drop across the conduction path of Ni is negligible and may be ignored) potential, via an Ni transistor conducting in the common source mode. Thus, the pulse V12 has a sharp leading (falling) edge. P1 and P2 remain turned-off after the pulse reaches or comes down to, 0 volts for a predetermined period (i.e. time $t_2$ to $t_5$, which corresponds to the propagation delays through I2, I3, and I4). This enables the low or zero level of the outut pulse to be well defined. Also since P1 and P2 are turned-off during most of the time that a negative-going pulse is being generated, there is little power dissipation. After the delay, at time $t_5$, P2 turns-on and, due to its very low ON impedance, very quickly charges up the WIRE-OR BUS towards $V_{DD}$ volts causing, very shortly thereafter (at time $t_6$), the turn-on of P1.

If P2 is turned-on after the turn-off of the Ni transistor initiating the precharge cycle there is very little average power dissipation. Although there is a substantial instantaneous power dissipation (P2-ON recharging CL), it occurs only for a very short time duration; e.g. where the pulse width is 6 to 10 nanoseconds, P2 will be ON also for 6 to 10 nanoseconds. Therefore, the circuit has a very low average power dissipation while its output response is extremely fast. Where the input signals Si are applied in such a sequence that an Ni transistor is turned-on during the time that P2 is turned-on (from time $t_5$ to $t_7$ in FIG. 3) the power dissipation in the system increases. But, the time period during which P2 is turned-on is very very short. Therefore, the average power dissipation remains low.

Figure 4B:
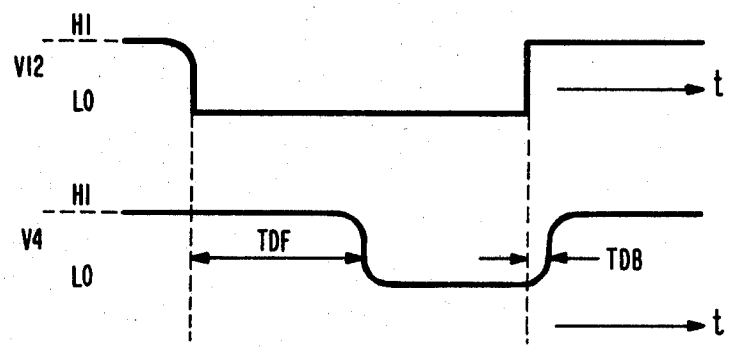
FIG. 4B is a diagram of waveforms associated with the circuit of FIG. 4A.

In order to reduce the time that P2 is ON the delay need not be symmetrical for both polarity (i.e. high-to-low and low-to-high) of signals generated on line 12 as illustrated in FIGS. 4A and 4B. Inverters I2, I3 and I4 forming delay network 20 are detailed using complementary IGFETs. The P-conductivity type transistors (PI2 and PI4) of inverters I2 and I4 are made larger than their corresponding N-conductivity type transistors (NI2 and NI4), and NI3 of inverter I3 is made large in comparison to PI3. As a result the delay (TDF) in response to high-to-low (negative-going) transition on line 12 is greater than the delay (TDB) in response to a low-to-high (positive going) transition on line 12.

The invention has been illustrated using two active (dynamically driven) transistors (P1 and P2). But, instead, the circuit could include a single load transistor (or other controllable impedance means) whose impedance or conductance is controlled by the voltage level on line 12. When all the inputs (Ar) are low (defining a static condition) the combination of P2 and P1 functions as a high impedance load connected between line 12 and $V_{DD}$. The impedance of the load (P1) during the static condition is designed to compensate for leakage currents (from line 12) to ground and to prevent line 12 from floating. The load impedance can, therefore, be very high. When an Ni transistor is turned-off (P2 already is off). As both P1 and P2 are off, they function as an extremely high impedance load. Following the generation of the output pulse of desired pulse width, P2 is turned-on for a short period of time (and P1 is also turned-on) to terminate the output pulse and to provide a sharp trailing edge (fast return to $V_{DD}$). The combination of P1 and P2 then functions as a low ON impedance circuit designed to very quickly restore the output line to its original (static) condition. Then P2 is turned-off and P1 is again turned-on.

This is in sharp contrast to the Prior Art circuit where: (a) the leading edge is restricted from falling sharply; (b) the final level of the pulse cannot reach the supply rail; and (c) the trailing edge cannot return quickly to its original level.

By dynamically driving the load with a signal generated on the output line of the circuit rather than using a passive pull up transistor (or a resistor) as in the Prior Art, extremely fast operation with low average power dissipation is achieved.

Thus, in circuits embodying the invention, although the input signals (e.g. changes on address lines) are randomly applied to the system, an output pulse or signal is produced very quickly after the occurrence of a change on an address line. The pulse or signal is well defined (i.e. goes from a full "low" to a full "high", or vice versa), has a sharp leading edge to define the start of the precharge and housekeeping function, and has a sharp trailing edge to terminate the precharge and housekeeping functions and to initiate a read-out or write cycle.

Figure 5:
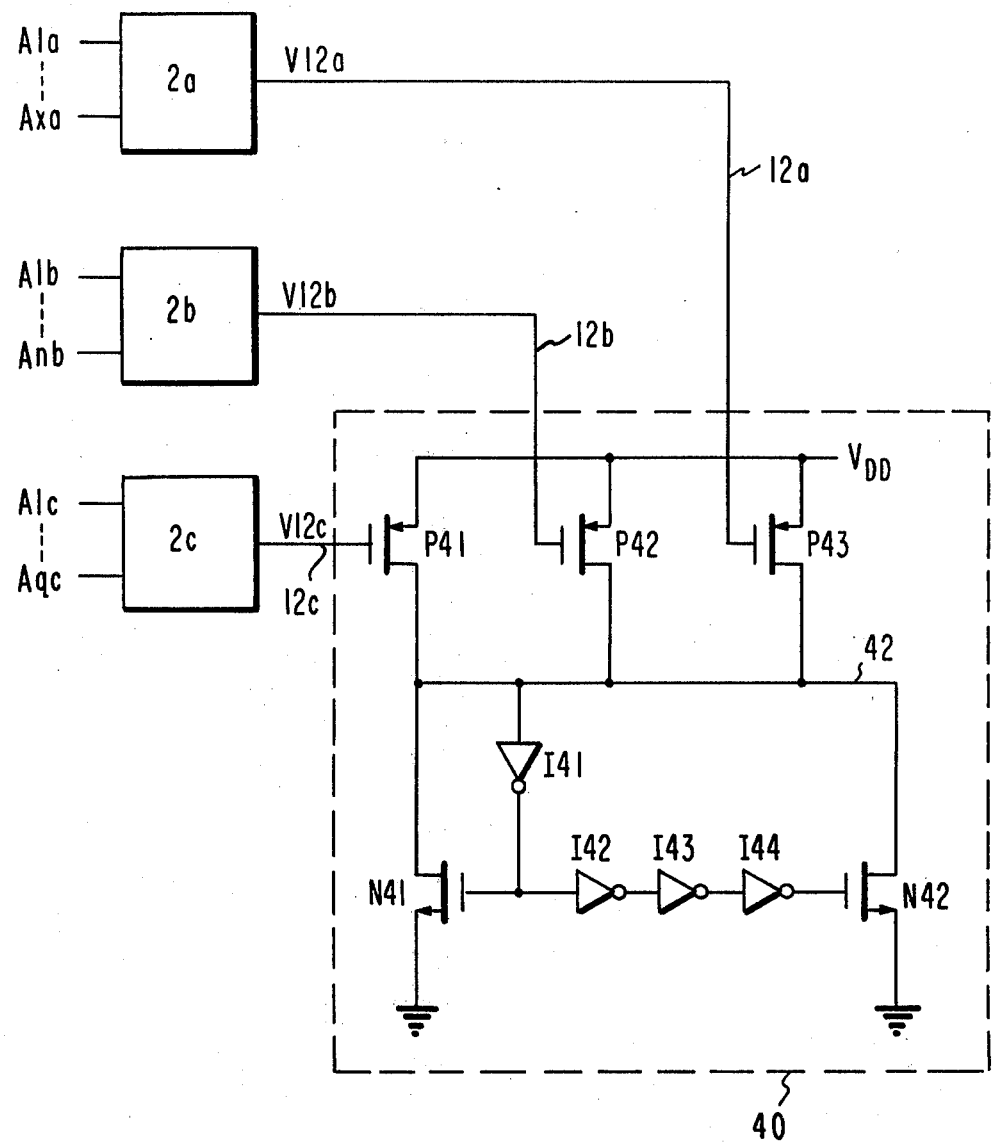
FIG. 5 is a schematic diagram of another circuit embodying the invention.

In the circuit of FIG. 5 three circuits 2a, 2b, and 2c similar to the circuit of FIG. 2 have their respective outputs V12a, V12b, and V12c connected via lines 12a, 12b and 12c to the gate electrodes of respective input transistors P41, P42 and P43. The number of address inputs (A1a to AXa, A1b to ANb, A1 to AXc) applied to circuits 2a, 2b and 2c need not be the same. For example, in the circuit of FIG. 2 a multiplicity (m) of input signals responsive transistors Ni are shown connected at node 12. In order to minimize the capacitance associated with node 12 and to obtain higher speed of operation it may be advantageous to limit the number of input signals in each subcircuit (2a, 2b, 2c). In any event, the outputs of two or more circuits of the type shown in FIG. 2 may be combined or gated in common as shown in FIG. 5. The WIRE-OR circuit shown in box 40 is the complementary version of the circuit of FIG. 2. The signal responsive transistors are transistors P4i of P-conductivity type having their conduction paths connected in parallel between $V_{DD}$ volts and a WIRE-OR line 42. The dynamic load includes a transistor N41 (corresponding to P1 of FIG. 2) and a transistor N42 (corresponding to P2 in FIG. 2) having their conduction paths connected in parallel between line 42 and ground. An inverter I41 (corresponding to I1) is connected at its input to line 42 and at its output to the gate of N41. Three inverters I42, I43 and I44 (corresponding to I2, I3 and I4) are connected in cascade between the output of I41 and the gate electrode of N42.

The circuit 40 of FIG. 5 functions in a complementary but otherwise similar manner to the circuit of FIG. 2 and need not be greatly detailed. Thus, when a negative-going pulse is produced on lines 12a, 12b or 12c a positive going output pulse is produced on output line 42. The pulse produced on line 42 may be directly connected to various portions of a subsequent circuit (not shown), or connected via a buffer to subsequent circuits.

It is evident from the circuit of FIG. 5 that the input signals can be combined in many different ways in an effort to optimize the system response. The circuit of FIG. 5 also demonstrates that circuits embodying the invention can easily be combined to perform combination logic.

What is claimed is:

1. In combination with an input signal responsive transistor having its conduction path connected between an output line and a first point of operating potential, said signal responsive transistor, when turned-on, tending to clamp said output line to said first point of potential, means for generating a well defined pulse on said output line having relatively sharp leading and trailing edges in response to the turn-on of said signal responsive transistor, comprising:

a controllable impedance load means connected between said output line and a second point of operating potential; and means responsive to the voltage on said output line coupled to said load means for:

(a) maintaining the impedance of said load means relatively high when said signal responsive transistor is OFF:

(b) switching the impedance of said load means to a very high value and substantially interrupting conduction therethrough for a given predetermined period of time when said signal responsive transistor is turned-on; and (c) switching the impedance of said load means to a very low value and enabling substantial conduction therethrough for a given time following said given predetermined period of time.

2. The combination as claimed in claim 1 wherein said controllable impedance load means includes first and second load transistors, each transistor having a conduction path and a control electrode; and wherein the conduction paths of said first and second transistors are connected in parallel between said output line and said second point of operating potential.

3. The combination as claimed in claim 2 wherein the conduction path of said first load transistor, when turned-on, has a higher impedance than that of said second load transistor.

4. The combination as claimed in claim 2 wherein said means responsive to the voltage on said output line coupled to said load means includes:
 (a) a first means coupled between said output line and the control electrode of said first load transistor for applying to its control electrode a signal which is out-of-phase with the signal on said output line; and
 (b) a second means responsive to the signal on said output line coupled to the control electrode of said second load transistor for applying to it a signal which is of the same polarity as, and delayed with respect to, the signal on said output line.

5. The combination as claimed in claim 4 wherein said first means includes an odd number of inverters connected in cascade between said output line and the control electrode of said first transistor, and
 wherein said second means includes an additional odd number of inverters connected in cascade between the control electrode of said first transistor and the control electrode of said second transistor.

6. The combination as claimed in claim 5 wherein said signal responsive transistor is normally turned-on by a relatively narrow pulse.

7. The combination comprising:
 a line;
 an input signal responsive transistor having its conduction path connected between said line and a first point of potential; said signal responsive transistor when turned-ON tending to clamp said line to said first point of potential;
 first and second load transistors, each having a conduction path and a control electrode, said conduction paths being connected in parallel between said line and a second point of potential;
 means connected between the control electrodes of said first and second load transistors and said line for applying a first signal to the control electrode of said first load transistor which is the inverse of the signal on said line and for applying a second signal to the control electrode of said second load transistor, responsive to the level on said line, of a polarity and magnitude to turn-on said second load transistor tending to clamp said line to said second point of potential a given time delay after the turn-off of said first load transistor and of a polarity and magnitude to turn-off said second load transistor when the voltage on said line subsequently rises towards said second point of potential.

8. The combination as claimed in claim 7 wherein said first transistor comprises a transistor exhibiting an ON impedance which is significantly greater than the ON impedance of said second transistor.

9. The combination as claimed in claim 8 wherein said first and second transistors are of one conductivity type and wherein said input signal responsive transistor is of opposite conductivity to said one conductivity type.

10. The combination as claimed in claim 8 wherein said means connected between the control electrodes of said first and second transistors and said line includes a first inverter connected between said line and the control electrode of said first transistor and an odd number of additional inverters connected in cascade between said output of said first inverter and the control electrode of said second transistor.

11. The combination comprising:
 a line;
 a first plurality of transistors having their conduction paths connected in parallel between said line and a first point of potential;
 input signal means coupled to said first plurality of transistors for turning them on, each one of said transistors of said first plurality of transistors when turned-ON tending to clamp said line to said first point of potential;
 a controllable load means connected between said line and a second point of potential;
 means responsive to the voltage level on said line coupled to said controllable load means for:
 (a) switching the impedance of said load means to a very high value and substantially interrupting conduction therethrough between said line and said second point of potential for a given predetermined period of time when a signal responsive transistor is turned-on;
 (b) switching the impedance of said load means to a very low value and enabling substantial conduction therethrough between said second point of potential and said line for a given period of time following said given predetermined period of time; and
 (c) setting the impedance of said load means to a relatively high value when all of said first plurality of transistors are non-conducting.

12. The combination comprising:
 a line;
 an input signal responsive transistor having its conduction path connected between said line and a first point of potential;
 input signal means coupled to said input signal responsive transistor for turning it on; said input signal responsive transistor when turned-ON tending to drive the potential on said line to said first point of potential;
 first and second transistors, each transistor having a conduction path and a control electrode, means connecting the conduction paths of said first and second transistors in parallel between said line and a second point of potential; and
 means responsive to the potential on said line coupled to the control electrodes of said first and second transistors for applying a turn-off signal to said first transistor, followed by a delayed turn-on signal to said second transistor when the potential on said line is being driven toward said first point of potential; and
 for applying a turn-on signal to said first transistor followed by a delayed turn-off signal to said second transistor when the potential on said line is driven towards the potential at said second point.

13. The combination as claimed in claim 12 wherein the ON impedance of said second transistor is significantly less than the ON impedance of said first transistor.

14. The combination as claimed in claim 13 further including a plurality of input signal responsive transistors having their conduction paths connected in parallel between said line and said first point of potential.

15. The combination as claimed in claim 2 wherein said means responsive to the voltage on said output line coupled to said load means includes:

a first means coupled between said output line and the control electrode of said first load transistor for turning-off said first load transistor when said signal responsive transistor is turned-on and for turning-on said first load transistor when the voltage on said line is at or close to the voltage at said second point of operating potential; and a second means responsive to the signal on said output line coupled to the control electrode of said second load transistor for turning-on said second load transistor a given time delay after the turn-off of said first load transistor and for turning-off said second load transistor after the turn-on of said first load transistor.

16. The combination as claimed in claim 2 further including additional input signal responsive transistors having their conduction paths connected in parallel with the conduction path of said input signal responsive transistor.

17. The combination comprising:

first and second terminals for the application therebetween of an operating potential;

an output line;

means connecting the conduction path of an input signal responsive transistor of first conductivity between said output line and said first terminal;

first and second transistors of second conductivity type, each having first and second electrodes defining the ends of a conduction path and a control electrode;

means connecting the conduction paths of said first and second transistors in parallel between said second terminal and said output line;

a first inverter connected at its input to said output line and at its output to the control electrode of said first transistor; and an odd number of inverters connected in cascade between the output of said first inverter and the control electrode of said second transistor.

18. The combination as claimed in claim 17 wherein the ON impedance of said second transistor is substantially less than the ON impedance of said first transistor.

19. The combination as claimed in claim 18 wherein said odd number of inverters function to delay the turn-on of said second transistor for a predetermined time after the turn-off of said first transistor.

* * * * *

UNITED STATES PATENT AND TRADEMARK OFFICE
CERTIFICATE OF CORRECTION

PATENT NO. : 4,404,474

DATED : September 13, 1983

INVENTOR(S) : Andrew Gordon Francis Dingwall

It is certified that error appears in the above-identified patent and that said Letters Patent is hereby corrected as shown below:

Col. 5, line 28, after "transistor is" insert --- turned-on, an output pulse is produced and P1 is ---.

Signed and Sealed this

Eleventh Day of June 1985

[SEAL]

Attest:

DONALD J. QUIGG

Attesting Officer     Acting Commissioner of Patents and Trademarks